United States Patent
Yoo

(10) Patent No.: US 10,609,816 B2
(45) Date of Patent: Mar. 31, 2020

(54) STRETCHABLE CONDUCTIVE PATTERN AND STRETCHABLE DEVICE

(71) Applicant: SAMSUNG DISPLAY CO., LTD., Yongin, Gyeonggi-Do (KR)

(72) Inventor: Byung Han Yoo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 111 days.

(21) Appl. No.: 14/716,993

(22) Filed: May 20, 2015

(65) Prior Publication Data

US 2016/0150641 A1 May 26, 2016

(30) Foreign Application Priority Data

Nov. 24, 2014 (KR) ........................ 10-2014-0164740

(51) Int. Cl.
*G06F 3/044* (2006.01)
*H05K 1/02* (2006.01)
*G06F 1/16* (2006.01)

(52) U.S. Cl.
CPC ......... *H05K 1/0283* (2013.01); *G06F 1/1626* (2013.01); *G06F 1/1652* (2013.01); *G06F 3/044* (2013.01); *G06F 2203/04102* (2013.01); *H05K 2201/0969* (2013.01)

(58) Field of Classification Search
CPC .............................. H05K 1/0283; G06F 3/044
See application file for complete search history.

(56) References Cited

U.S. PATENT DOCUMENTS

| 8,207,473 | B2 | 6/2012 | Axisa et al. | |
|---|---|---|---|---|
| 8,217,381 | B2 | 7/2012 | Rogers et al. | |
| 2008/0303441 | A1* | 12/2008 | Hwang | H01J 11/16 313/584 |
| 2009/0084613 | A1* | 4/2009 | Yang | G06F 3/044 178/18.06 |
| 2012/0019473 | A1* | 1/2012 | Edwards | G06F 3/044 345/174 |
| 2012/0075226 | A1* | 3/2012 | Andoh | G06F 3/046 345/173 |
| 2012/0127099 | A1* | 5/2012 | Liu | G06F 3/044 345/173 |
| 2014/0061605 | A1* | 3/2014 | Kim | G09G 3/3208 257/40 |
| 2014/0184552 | A1* | 7/2014 | Tanemura | G06F 3/044 345/174 |

(Continued)

FOREIGN PATENT DOCUMENTS

KR 10-2014-0033966 A 3/2014
KR 10-2014-0051007 A 4/2014

OTHER PUBLICATIONS

John A. Rogers, et al., "Materials and Mechanics for Stretchable Electronics", www.sciencemag.org, vol. 327, Mar. 26, 2010, pp. 1603-1607.

*Primary Examiner* — Nelson M Rosario
*Assistant Examiner* — Scott Au
(74) *Attorney, Agent, or Firm* — Lewis Roca Rothgerber Christie LLP

(57) ABSTRACT

A stretchable conductive pattern includes a plurality of first closed loop parts spaced apart from each other in a first direction, and at least one first line part extended in the first direction and connecting between adjacent first closed loop parts among the plurality of first closed loop parts.

15 Claims, 9 Drawing Sheets

(56) References Cited

U.S. PATENT DOCUMENTS

2015/0223328 A1* 8/2015 Endoh ...................... B32B 7/02
                                                    345/174
2016/0283009 A1* 9/2016 Sun ...................... G06F 3/0412

* cited by examiner

STRETCHABLE CONDUCTIVE PATTERN AND STRETCHABLE DEVICE

CROSS-REFERENCE TO RELATED APPLICATION

Korean Patent Application No. 10-2014-0164740, filed on Nov. 24, 2014, in the Korean Intellectual Property Office, and entitled: "Stretchable Conductive Pattern and Stretchable Device," is incorporated by reference herein in its entirety.

BACKGROUND

1. Field

The present disclosure relates to a stretchable conductive pattern and a stretchable device.

2. Description of the Related Art

In general, a stretchable device is a device having elastic restoring force and is capable of stretching. Examples of a stretchable device may include a device, e.g., an organic light emitting display, a touch panel, or the like, with a stretchable substrate, e.g., including a polymer or the like as a substrate. For example, as the stretchable device, the substrate, an organic light emitting layer, an encapsulation, and the like of the organic light emitting display is formed of a polymer having elastic restoring force, and the substrate, or the like of the touch panel is formed of a polymer, both of which become stretchable.

SUMMARY

An exemplary embodiment of the present disclosure provides a stretchable conductive pattern, including a plurality of first closed loop parts spaced apart from each other in a first direction, and at least one first line part extended in the first direction and connecting between adjacent first closed loop parts among the plurality of first closed loop parts.

The first closed loop part may have a rhombus shape.

The first closed loop part may have a closed loop shape which is extended in a curve.

The first line part may have a shape which is extended in a straight line.

The plurality of first closed loop parts and the first line part may be formed integrally with each other.

The first closed loop part may have an area larger than the first line part.

The stretchable conductive pattern may further include: a plurality of second closed loop parts spaced apart from each other and disposed in the other direction that intersects with one direction; and at least one second line part extended in the other direction, connecting between the second closed loop parts neighboring each other among the plurality of second closed loop parts, and intersecting with the first line parts to be overlapped.

The plurality of second closed loop parts and the second line part may be formed integrally with each other.

The second line part may be formed integrally with the first line part.

One direction and the other direction may be perpendicular to each other, and the first closed loop part may neighbor to the second closed loop part.

Another embodiment of the present disclosure provides a stretchable device including: a stretchable substrate; and a stretchable conductive pattern including a plurality of first closed loop parts spaced apart from each other and disposed in one direction on the stretchable substrate, and at least one first line part extended in one direction, connecting between the first closed loop parts neighboring each other among the plurality of first closed loop parts, and supported by the stretchable substrate.

The plurality of first closed loop parts may be floated from the stretchable substrate.

The plurality of first closed loop parts and the first line part may be formed integrally with each other.

The stretchable conductive pattern may further include: a plurality of second closed loop parts spaced apart from each other and disposed in the other direction that intersects with one direction on the stretchable substrate; and at least one second line part extended in the other direction, connecting between the second closed loop parts neighboring each other among the plurality of second closed loop parts, intersecting with the first line parts to be overlapped, and supported by the stretchable substrate.

The plurality of second closed loop parts may be floated from the stretchable substrate.

The plurality of second closed loop parts and the second line part may be formed integrally with each other.

The second line part may be formed integrally with the first line part.

One direction and the other direction may be perpendicular to each other, and the first closed loop part may neighbor to the second closed loop part.

The stretchable conductive pattern may be a touch sensor of a self capacitance type.

The stretchable conductive pattern may be a touch sensor of a mutual capacitance type that further includes a first touch line including the plurality of first closed loop parts and the first line part; and a second touch line intersecting with the first touch line to be insulated therefrom and including the plurality of second closed loop parts and the second line part.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
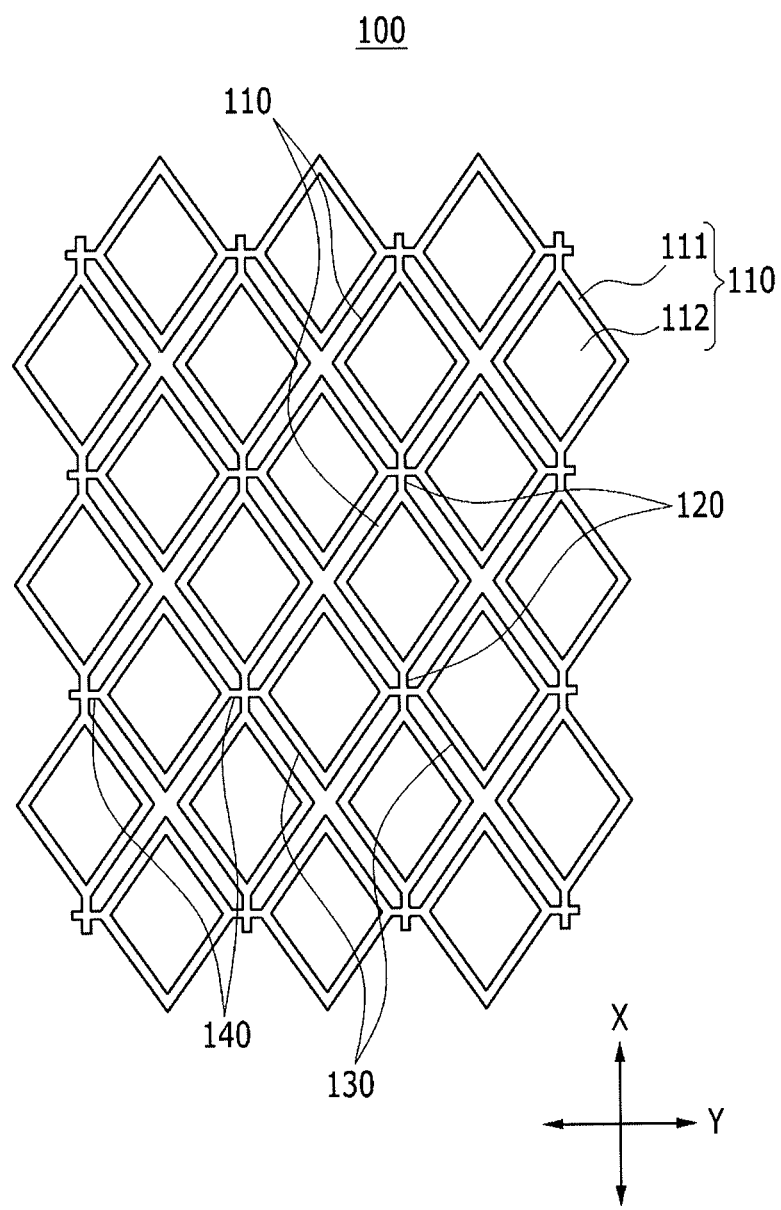
FIG. 1 illustrates a plan view showing a stretchable conductive pattern according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In addition, unless explicitly described to the contrary, the word "comprise" and variations such as "comprises" or "comprising", will be understood to imply the inclusion of stated elements but not the exclusion of any other elements. In addition, throughout the specification, when an element is referred to as being "on" another element, it means that the element is positioned on or below of a target portion, and does not necessarily mean that the element is positioned at an upper side based on a gravity direction.

Hereinafter, a stretchable conductive pattern according to an exemplary embodiment will be described with reference to FIGS. 1 to 3.

FIG. 1 is a plan view of a stretchable conductive pattern according to an exemplary embodiment.

As shown in FIG. 1, a stretchable conductive pattern 100 according to an exemplary embodiment is stretchable and includes a first closed loop part 110, a first line part 120, a second closed loop part 130, and a second line part 140. The stretchable conductive pattern 100 may be formed of a thin film.

The first closed loop part 110 has an extended closed loop shape. There is a plurality of first closed loop parts 110, and the plurality of first closed loop parts 110 are spaced apart from each other and are disposed in a first direction X. The first closed loop part 110 includes a conductive material, e.g., metal or the like. The first closed loop part 110 has a central portion of an opened rhombus shape, e.g., the first closed loop part 110 may include a rhombus-shaped frame 111 surrounding a rhombus-shaped opening 112. The first closed loop part 110 has an area larger than the first line part 120, and the first line part 120 is connected to one vertex of the first closed loop part 110.

The first line part 120 is extended in the first direction X and has a straight. e.g., linear, line shape. There is a plurality of first line parts 120, and the plurality of first line parts 120 is disposed among the plurality of first closed loop parts 110. The first line part 120 connects between the first closed loop parts 110 neighboring each other among the plurality of first closed loop parts 110. For example, as illustrated in FIG. 1, each first line part 120 may connect two first closed loop parts 110 adjacent to each other along the first direction X. The first line part 120 is formed integrally with the first closed loop part 110, and includes the same conductive material as the first closed loop part 110. The first line part 120 has an area smaller than the first closed loop part 110, e.g., a length of the first line part 120 along the first direction X is smaller than a length of one first closed loop part 110 between opposite vertices along the first direction X.

According to another exemplary embodiment, the first line part 120 may be formed of a material different from the first closed loop part 110. In this case, the first line part 120 and the first closed loop part 110 may not be formed integrally with each other, but may be formed in a shape in which they are connected to each other.

According to an exemplary embodiment, as described previously and as illustrated in FIG. 1, the stretchable conductive pattern 100 includes the first closed loop part 110, the first line part 120, the second closed loop part 130, and the second line part 140. However, according to another example, the stretchable conducive pattern 100 may only include the first closed loop part 110 and the first line part 120.

Referring back to FIG. 1, the second closed loop part 130 has an extended closed loop shape. There is a plurality of second closed loop parts 130, and the plurality of second closed loop parts 130 are spaced apart from each other and are disposed in a second direction Y which intersects with the first direction X. For example, the first direction X may be perpendicular to the second direction Y, but is not limited thereto. For example, as long as the first direction X and the second direction Y intersect with each other, they may also be extended to any direction.

The second closed loop part 130 is spaced apart from the first closed loop part 110 and neighbors the first closed loop part 110 at the same time. The second closed loop part 130 includes a conductive material, e.g., metal or the like. The second closed loop part 130 has a central portion of an opened rhombus shape. The second closed loop part 130 has an area larger than the second line part 140, and the second line part 140 is connected to one vertex of the second closed loop part 130.

The second line part 140 is extended in the second direction Y and has a straight line shape. There is a plurality of second line parts 140, and the plurality of second line parts 140 is disposed among the plurality of second closed loop parts 130. The second line part 140 connects between the second closed loop parts 130 neighboring each other among the plurality of second closed loop parts 130. For example, as illustrated in FIG. 1, each second line part 140 may connect two second closed loop parts 130 adjacent to each other along the second direction Y. The second line part 140 is formed integrally with the second closed loop part 130 and includes the same conductive material as the second closed loop part 130. The second line part 140 has an area smaller than the second closed loop part 130. The second line part 140 intersects with the first line part 120 so as to be overlapped. The second line part 140 may be formed integrally with the first line part 120, and may include a same conductive material as the first line part 120. Thereby, the first closed loop part 110, the first line part 120, the second line part 140, and the second closed loop part 130 may be formed integrally with each other, and each of the first closed loop part 110, the first line part 120, the second line part 140, and the second closed loop part 130 may include a same conductive material.

According to another exemplary embodiment, the second line part 140 may be formed of a material different from the second closed loop 130. In this case, the second line part 140 and the second closed loop part 130 may not be formed integrally with each other, but may be formed in a shape in which they are connected to each other.

According to an exemplary embodiment, the stretchable conductive pattern 100 includes the first closed loop part 110, the first line part 120, the second closed loop part 130, and the second line part 140. However, according to another example, the stretchable conducive pattern 100 may only include the second closed loop part 130 and the second line part 140.

Hereinafter, stretchability of the stretchable conductive pattern 100 according to an exemplary embodiment described above will be described with reference to FIGS. 2 and 3. FIG. 2 is a plan view showing a state in which the stretchable conductive pattern 100 is pulled in the first direction X, and FIG. 3 is a plan view showing a state in which the stretchable conductive pattern 100 is pulled in the second direction Y.

Figure 2:
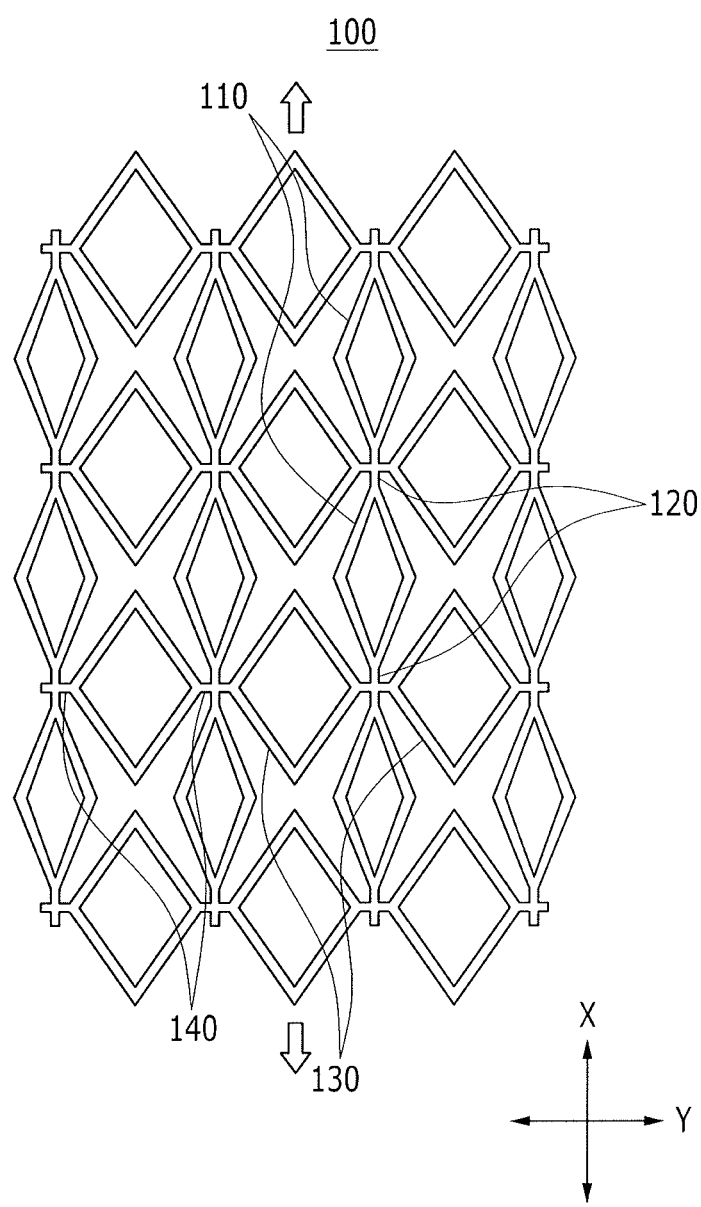
FIG. 2 illustrates a plan view showing a state in which the stretchable conductive pattern shown in FIG. 1 is pulled in one direction.

As shown in FIG. 2, when the stretchable conductive pattern 100 according to an exemplary embodiment of the present disclosure is pulled in the first direction X, while supporting the first line part 120 of the stretchable conductive pattern 100, the first closed loop part 110 of the stretchable conductive pattern 100 is tensioned, e.g., stretched, in the first direction X and is contracted in the second direction Y, such that the stretchable conductive pattern 100 is generally tensioned in the first direction X. In this case, stress applied to the first line part 120 is dispersed by the first closed loop part 110 connected to the first line part 120, such that damage to the first line part 120 by the stress is prevented or substantially minimized. In addition, stress applied to the second line part 140 which is formed integrally with the first line part 120 is applied in a lateral direction of the second line part 140 having an aspect ratio, so as not to be applied to the second closed loop part 130 connected to the second line part 140. That is, when the stretchable conductive pattern 100 is pulled in the first direction X, which is an arrangement direction of the first closed loop parts 110, the first closed loop part 110 is tensioned in the first direction X, while the second closed loop part 130 is maintained in an unstretched form (FIG. 2), such that the stretchable conductive pattern 100 is not damaged by the stress applied thereto and is easily tensioned.

Figure 3:
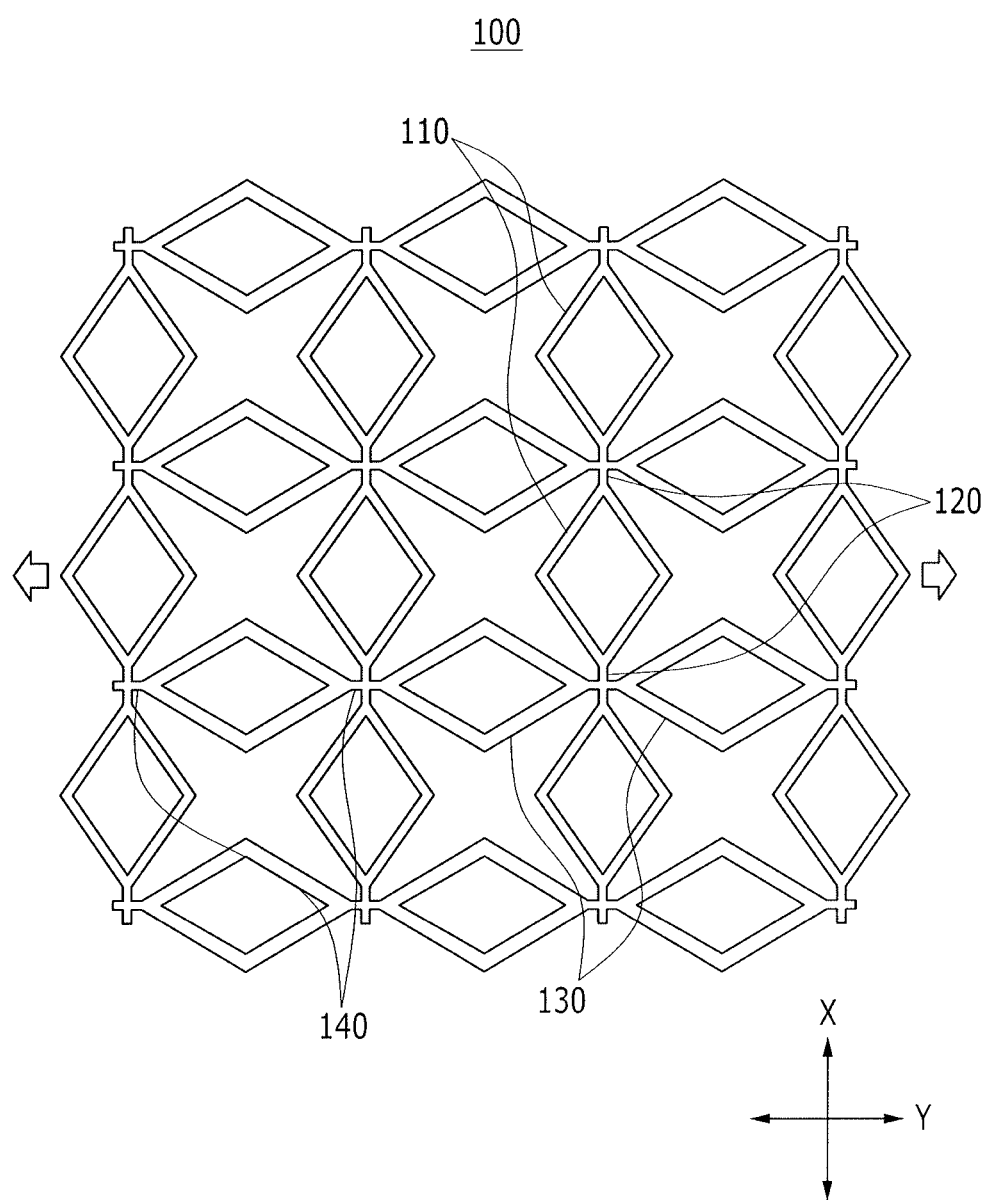
FIG. 3 illustrates a plan view showing a state in which the stretchable conductive pattern shown in FIG. 1 is pulled in another direction.

As shown in FIG. 3, when the stretchable conductive pattern 100 according to an exemplary embodiment is pulled in the second direction Y, while supporting the second line part 140 of the stretchable conductive pattern 100, the second closed loop part 130 of the stretchable conductive pattern 100 is tensioned, e.g., stretched, in the second direction Y and is contracted in the first direction X, such that the stretchable conductive pattern 100 is generally tensioned in the second direction Y. In this case, stress applied to the second line part 140 is dispersed by the second closed loop part 130 connected to the second line part 140, such that damage to the second line part 140 by stress may be prevented or substantially minimized. In addition, stress applied to the first line part 120, which is formed integrally with the second line part 140, is applied in a lateral direction of the first line part 120 having an aspect ratio, so as not to be applied to the first closed loop part 110 connected to the first line part 120. That is, when the stretchable conductive pattern 100 is pulled in the second direction Y, which is an arrangement direction of the second closed loop parts 130, the second closed loop part 130 is tensioned in the second direction Y, such that the stretchable conductive pattern 100 is not damaged by the stress applied thereto and is easily tensioned.

As described above, the stretchable conductive pattern 100 according to an exemplary embodiment includes the first closed loop part 110, the first line part 120, the second closed loop part 130, and the second line part 140, so as to be easily tensioned by tension force applied to the first direction X and the second direction Y, respectively. That is, the stretchable conductive pattern 100 which is suitable for the stretchable device is provided.

Hereinafter, a stretchable conductive pattern according to another exemplary embodiment will be described with reference to FIG. 4. Hereinafter, only portions which are different from the stretchable conductive pattern 100 in FIGS. 1-3 described above will be described.

Figure 4:
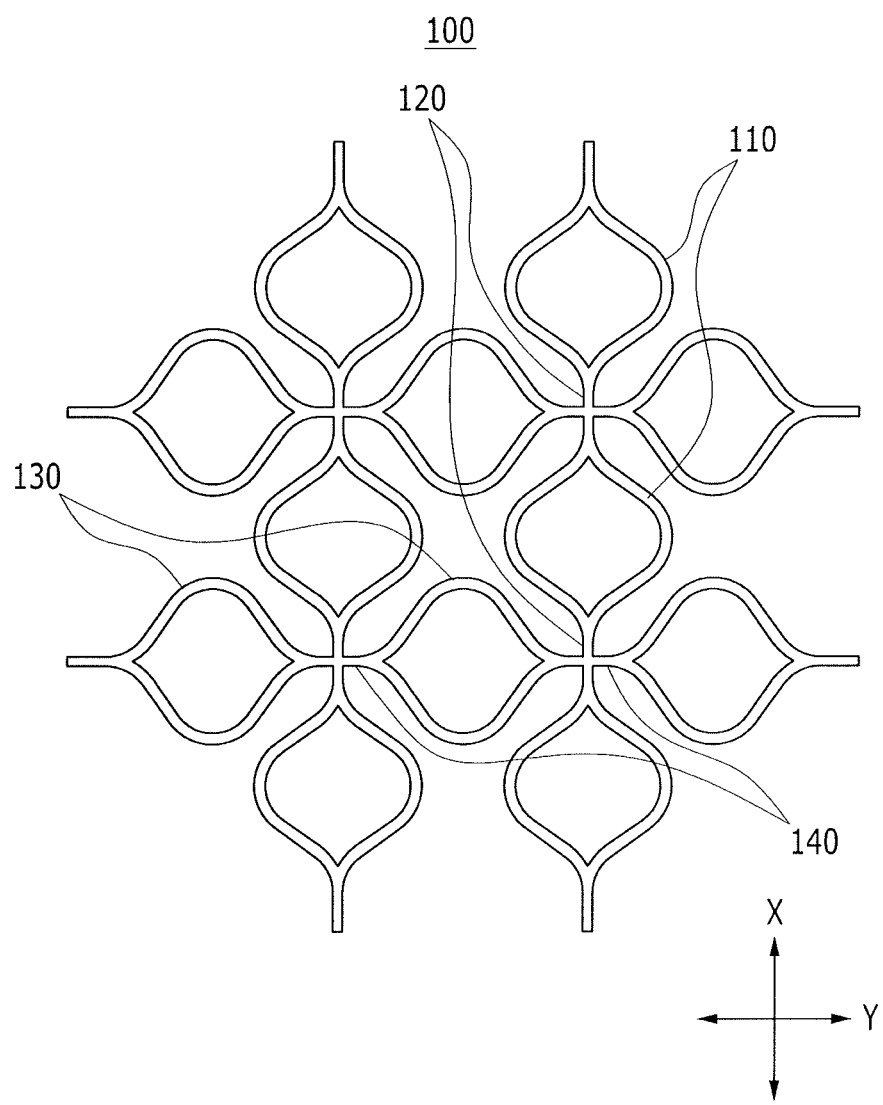
FIG. 4 illustrates a plan view showing a stretchable conductive pattern according to another exemplary embodiment of the present disclosure.

FIG. 4 is a plan view showing a stretchable conductive pattern according to another exemplary embodiment.

As shown in FIG. 4, each of a first closed loop part 110 and a second closed loop part 130 of a stretchable conductive pattern 100 according to another exemplary embodiment of the present disclosure has a closed loop shape which is extended in a curve. As such, each of the first closed loop part 110 and the second closed loop part 130 of the stretchable conductive pattern 100 has a closed loop shape which is extended in a curve, such that when stress applied to each of the first closed loop part 110 and the second closed loop part 130 upon tensioning the stretchable conductive pattern 100 is dispersed by the curve, the stretchable conductive pattern 100 is not damaged by the stress applied thereto and is easily tensioned.

Figure 5:
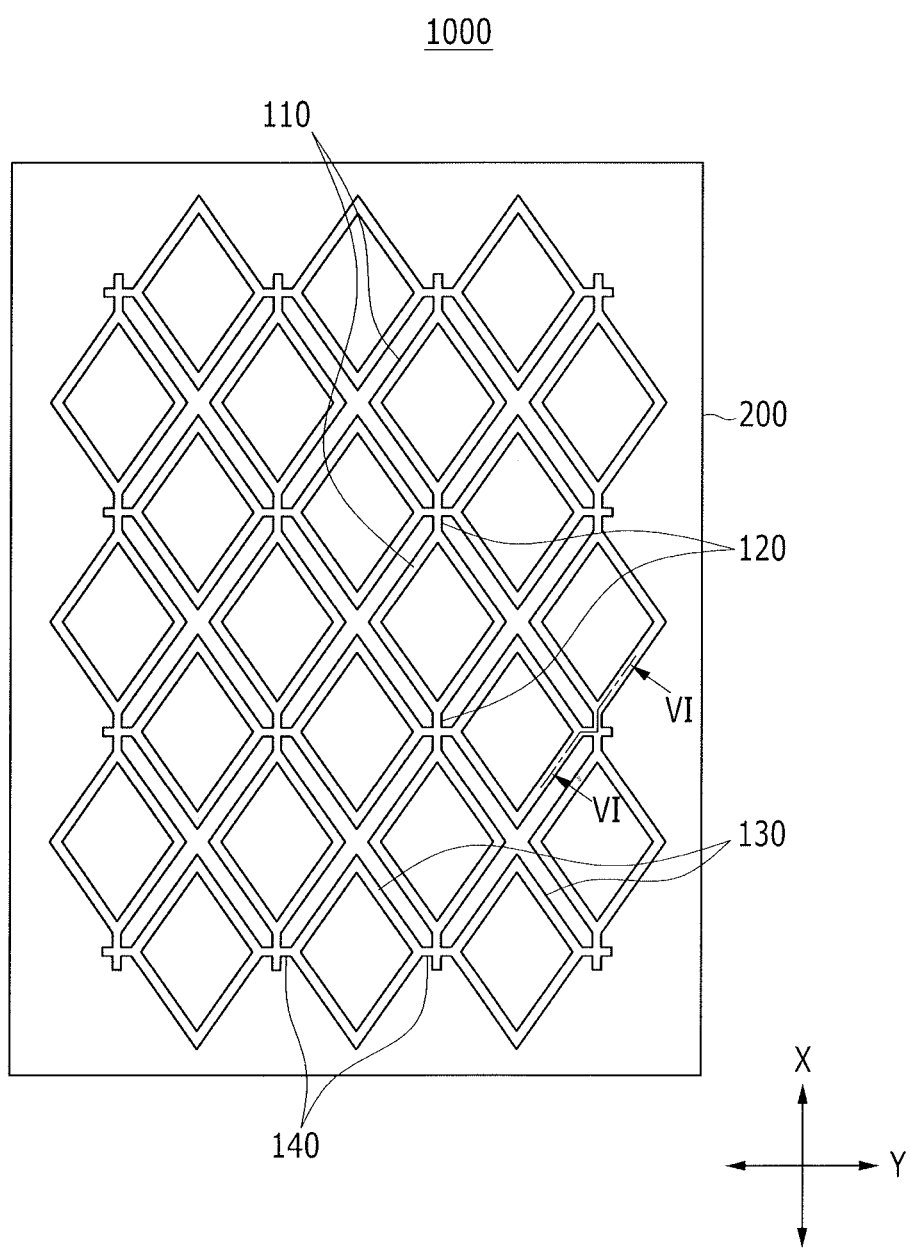
FIG. 5 illustrates a plan view showing a stretchable device according to yet another exemplary embodiment of the present disclosure.
Figure 6:
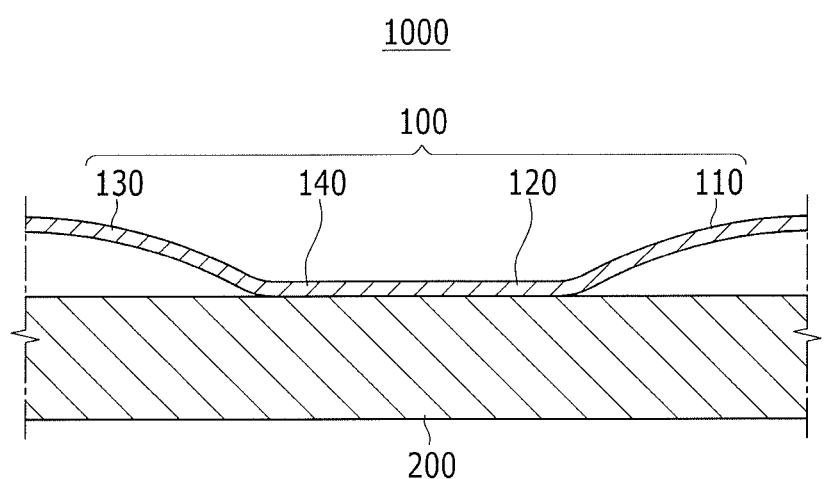
FIG. 6 illustrates a cross-sectional view taken along the line VI-VI of FIG. 5.

Hereinafter, a stretchable device according to yet another exemplary embodiment will be described with reference to FIGS. 5 to 7. FIG. 5 is a plan view showing a stretchable device according to another exemplary embodiment. FIG. 6 is a cross-sectional view taken along the line VI-VI of FIG. 5.

As shown in FIGS. 5 and 6, a stretchable device 1000 according to another exemplary embodiment includes a stretchable substrate 200 and a stretchable conductive pattern 100.

The stretchable substrate 200 is an insulating substrate, e.g., including polymer or the like. The stretchable substrate 200 is stretchable, but is not limited thereto. For example, the stretchable substrate 200 may be flexible, foldable, bendable, or rollable. The stretchable substrate 200 is stretchable, flexible, foldable, bendable, or rollable, such that the whole stretchable device 1000 may be flexible, stretchable, foldable, bendable, or rollable.

The stretchable conductive pattern 100 is stretchable and includes a first closed loop part 110, a first line part 120, a second closed loop part 130, and a second line part 140. The stretchable conductive pattern 100 may be formed of a thin film. The shape of the stretchable conductive pattern 100 may be the same as that of the stretchable conductive pattern 100 in FIGS. 1-3 discussed previously.

Each of the first line part 120 and the second line part 140 of the stretchable conductive pattern 100 is supported by the stretchable substrate 200, e.g., each of the first line part 120 and the second line part 140 may extend directly on the stretchable substrate 200. Further, each of the plurality of first closed loop parts 110 and the plurality of second closed loop parts 130 is floated from the stretchable substrate 200. For example, as illustrated in FIG. 6, each of the plurality of first closed loop parts 110 and the plurality of second closed loop parts 130 extends above the stretchable substrate 200, such that a space is defined between the stretchable substrate 200 and a bottom of each of the first and second closed loop parts 110 and 130. That is, since each of the plurality of first closed loop parts 110 and the plurality of second closed loop parts 130 is floated from the stretchable substrate 200, spaces are each formed between the stretchable substrate 200 and the first closed loop part 110 and between the stretchable substrate 200 and the second closed loop part 130.

Meanwhile, each of the first closed loop part 110 and the second closed loop part 130 of the stretchable conductive pattern 100 is floated from the stretchable substrate 200, but the present disclosure is not limited thereto. For example, according to another exemplary embodiment, each of the first closed loop part 110 and the second closed loop part 130 may be supported by the stretchable substrate 200.

Hereinafter, stretchability of the stretchable device 1000 will be described with reference to FIG. 7. FIG. 7 is a plan view showing a state in which the stretchable device 1000 is pulled in the first direction X.

Figure 7:
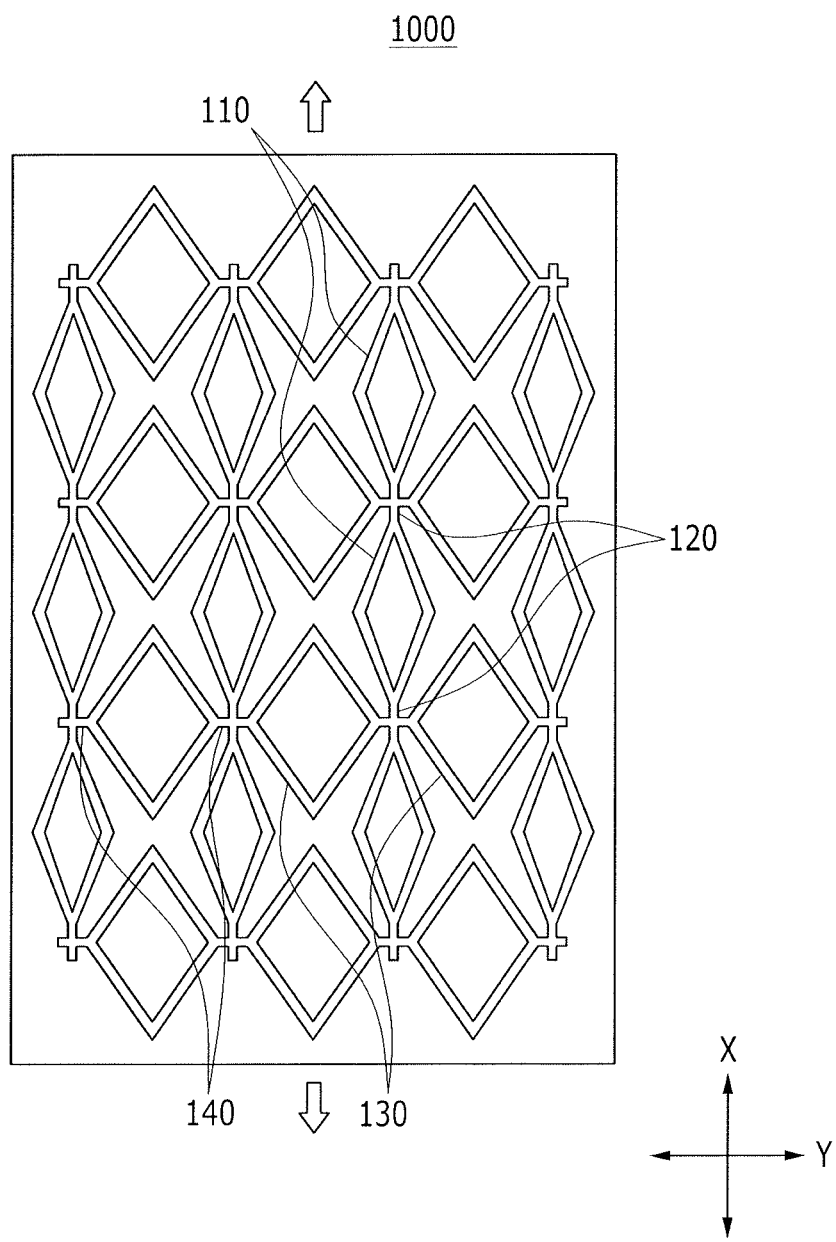
FIG. 7 illustrates a plan view showing a state in which the stretchable device shown in FIG. 5 is pulled in one direction.

As shown in FIG. 7, when the stretchable device 1000 is pulled in the first direction X, while supporting an edge of the stretchable substrate 200 of the stretchable device 1000, the stretchable substrate 200 is tensioned in the first direction X and the first closed loop part 110 of the stretchable conductive pattern 100 having the first line part 120 supported by the stretchable substrate 200 is tensioned in the first direction X and is contracted in the second direction Y, such that the stretchable substrate 200 and the stretchable conductive pattern 100 are generally tensioned in the first direction X. In this case, stress applied to the first line part 120 supported by the stretchable substrate 200 is dispersed by the first closed loop part 110 connected to the first line part 120, such that damage to the first line part 120 is prevented or substantially minimized. In addition, stress applied to the second line part 140 which is formed integrally with the first line part 120 is applied in a lateral direction of the second line part 140 having an aspect ratio, so as not to be applied to a second closed loop part 130 connected to the second line part 140.

That is, when the stretchable device 1000 is pulled in the first direction X, which is an arrangement direction of the first closed loop parts 110, the first closed loop part 110 floated from the stretchable substrate 200 is tensioned in the first direction X, such that the stretchable conductive pattern 100 is not damaged by the stress applied thereto while the stretchable substrate 200 is tensioned, and is easily tensioned.

In addition, when the stretchable device 1000 is pulled in the second direction Y, while supporting the second line part 140 of the stretchable conductive pattern 100 in the second direction Y by supporting an edge of the stretchable substrate 200 of the stretchable device 1000, the stretchable substrate 200 is tensioned in the second direction Y, and the second closed loop part 130 of the stretchable conductive pattern 100 having the second line part 140 supported by the stretchable substrate 200 is tensioned in the second direction Y and is contracted in the first direction X, such that the stretchable substrate 200 and the stretchable conductive pattern 100 are generally tensioned in the second direction Y. In this case, stress applied to the second line part 140 supported by the stretchable substrate 200 is dispersed by the second closed loop part 130 connected to the second line part 140, such that damage to the second line part 140 by the stress is suppressed. In addition, stress applied to the first line part 120, which is formed integrally with the second line part 140, is applied in a lateral direction of the first line part 120 having an aspect ratio, so as not to be applied to the first closed loop part 110 connected to the first line part 120.

That is, when the stretchable device 1000 is pulled in the second direction Y, which is an arrangement direction of the second closed loop parts 130, the second closed loop part 130 floated from the stretchable substrate 200 is tensioned in the second direction Y, such that the stretchable conductive pattern 100 is not damaged by the stress applied thereto while the stretchable substrate 200 is tensioned, and is easily tensioned.

As such, the stretchable device 1000 includes the stretchable substrate 200 and the stretchable conductive pattern 100, so as to be easily tensioned by tension force applied to each of the direction X and the second direction Y. That is, the stretchable device 1000 which is stretchable is provided.

The stretchable device 1000 described above may be, e.g., a touch panel, an organic light emitting display, or the like. In the case in which the stretchable device 1000 is an organic light emitting display, the stretchable conductive pattern 100 may be, e.g., a positive electrode or a negative electrode. In the case in which the stretchable conductive pattern 100 is a positive electrode or a negative electrode, an organic light emitting layer that emits light may be positioned so as to correspond to at least one of the first line part 120 and the second line part 140 which are supported by the stretchable substrate 200.

Hereinafter, a stretchable device according to yet another exemplary embodiment will be described with reference to FIG. 8. Hereinafter, only portions which are different from the stretchable device 1000 will be described.

Figure 8:
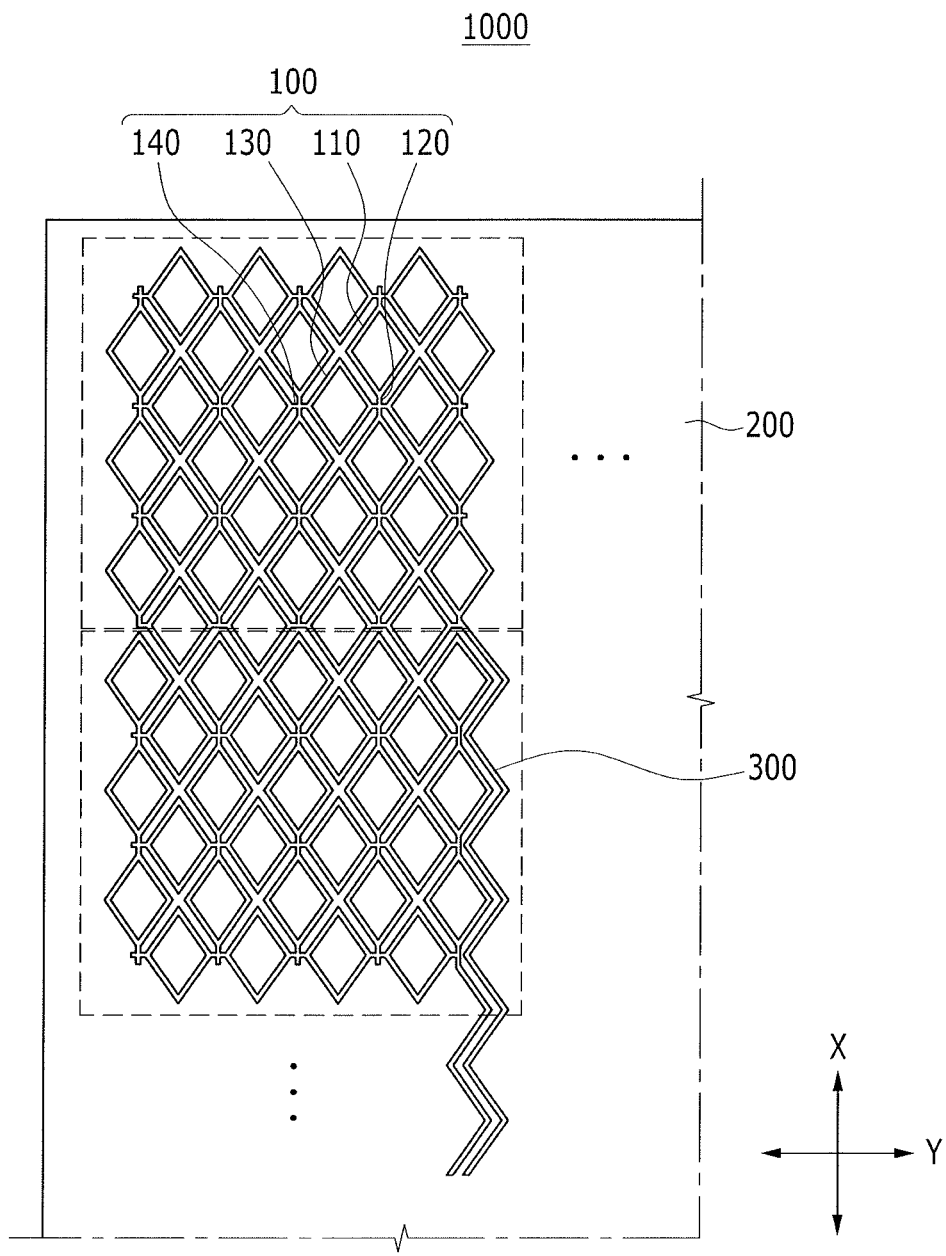
FIG. 8 illustrates a plan view showing a stretchable device according to still another exemplary embodiment of the present disclosure.

FIG. 8 is a plan view showing a portion of a stretchable device according to another exemplary embodiment.

As shown in FIG. 8, a stretchable device 1000 according to another exemplary embodiment includes the stretchable substrate 200, a stretchable conductive pattern 100, and a connection line 300.

The stretchable conductive pattern 100 is formed as a touch sensor of a self capacitance type, and each of a plurality of stretchable conductive patterns 100 is formed as the touch sensor. An overall structure of the stretchable device 1000 except for the stretchable conductive pattern 100 and the connection line 300 may have any suitable structure of a self capacitance type touch panel. The stretchable conductive pattern 100 has the connection line 300 connected thereto.

The connection line 300 is connected to the stretchable conductive pattern 100 and is formed in a form which is bent and extended multiple times in accordance with tension of the stretchable substrate 200. The connection line 300 may be formed integrally with the stretchable conductive pattern 100 or be formed of a material which is different from that of the stretchable conductive pattern 100.

As such, the stretchable device 1000 according to another exemplary embodiment includes the stretchable conductive pattern 100 which is formed as the touch sensor of the self capacitance type, so as to be easily tensioned by tension force applied to each of the first direction X and the second direction Y. That is, the stretchable device 1000, which is a stretchable touch panel, is provided.

Hereinafter, a stretchable device according to another exemplary embodiment will be described with reference to FIG. 9. Hereinafter, only portions which are different from the stretchable device 1000 will be described.

Figure 9:
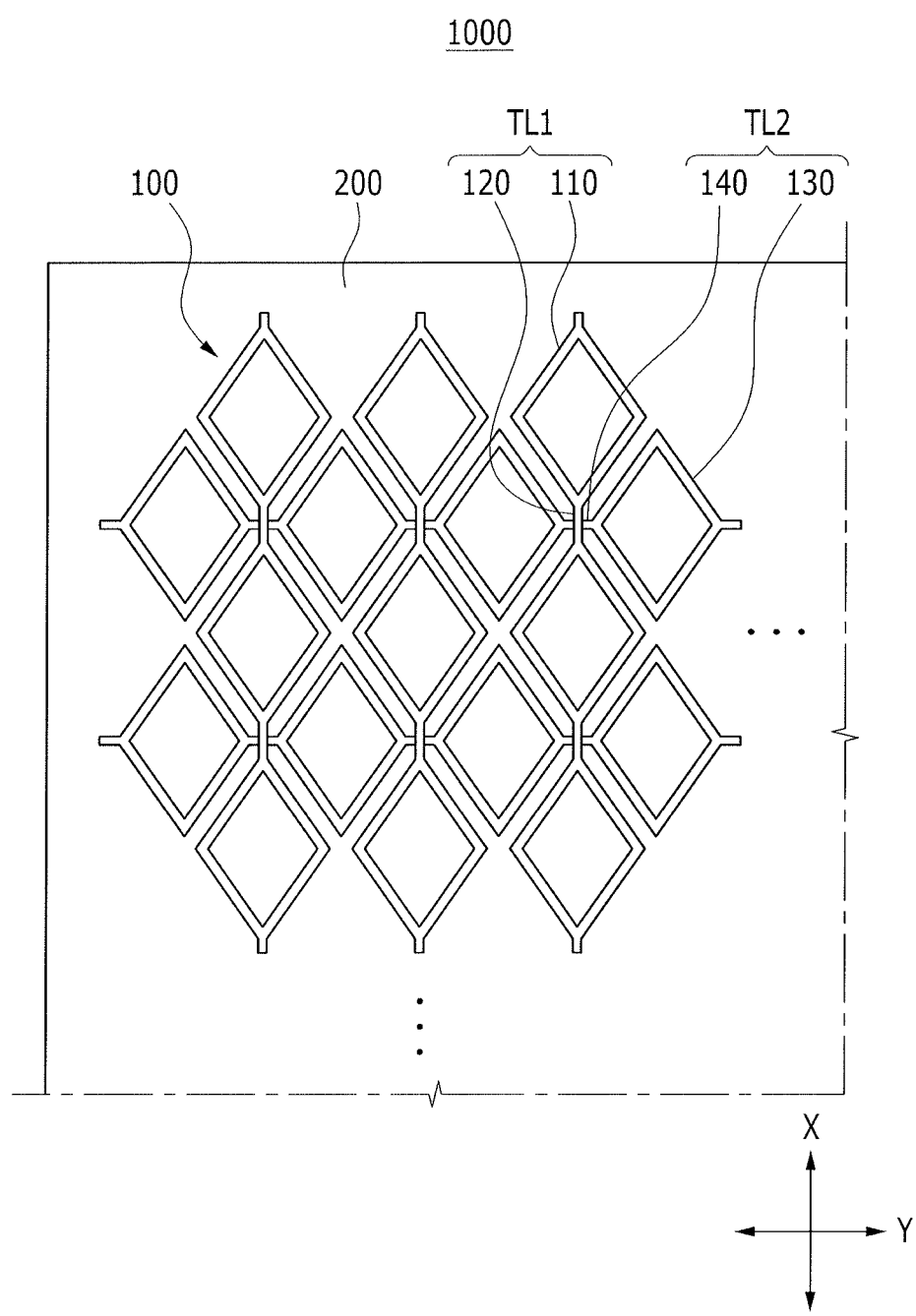
FIG. 9 illustrates a plan view showing a stretchable device according to yet another exemplary embodiment of the present disclosure.

FIG. 9 is a plan view showing a portion of a stretchable device according to another exemplary embodiment.

As shown in FIG. 9, a stretchable device 1000 according to another exemplary embodiment includes the stretchable substrate 200, a first touch line TL1, and a second touch line TL2 which are formed by the stretchable conductive pattern 100.

The first touch line TL1 includes a plurality of first closed loop parts 110 and a plurality of first line parts 120, and is extended in the first direction X. The second touch line TL2 includes a plurality of second closed loop parts 130 and a plurality of second line parts 140, and is extended in the second direction Y. The second touch line TL2 intersects with the first touch line TL to be insulated from each other, and the first touch line TL1 and the second touch line TL2 may be each formed of different materials and disposed on different layers.

The first touch line TL1 and the second touch line TL2 which are formed by the stretchable conductive pattern 100 are formed as a touch sensor of a mutual capacitance type. An overall structure of the stretchable device 1000 except for the first touch line TL1 and the second touch line TL2, which are the stretchable conductive pattern 100, may have any suitable structure of a mutual capacitance type touch panel. As such, the stretchable device 1000 includes the first touch line TL1 and the second touch line TL2 formed by the stretchable conductive pattern 100 which are formed as the touch sensor of the mutual capacitance type, so as to be easily tensioned by tension force applied to each of the first direction X and the second direction Y. That is, the stretchable device 1000, which is a stretchable touch panel, is provided.

By way of summation and review, in order to more easily make a stretchable device, a conductive pattern of a wire, or the like, in a display device or in a touch sensor for sensing a touch also needs to become stretchable. Therefore, according to embodiments, a stretchable conductive pattern which is stretchable so as to be suitable for the stretchable device and the stretchable device including the same is provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stretchable conductive pattern, comprising:
a plurality of first closed loop parts spaced apart from each other in a first direction, each one of the plurality of first closed loop parts including an opening surrounded by a closed-shaped frame;
a plurality of second closed loop parts spaced apart from each other in a second direction crossing the first direction, each one of the plurality of second closed loop parts including an opening surrounded by a closed-shaped frame;
at least one first line part extended in the first direction and connecting between adjacent first closed loop parts among the plurality of first closed loop parts; and
at least one second line part extended in the second direction and connecting between adjacent second closed loop parts among the plurality of second closed loop parts,
wherein the at least one first line part directly connects the closed-shaped frames,
wherein the plurality of first closed loop parts have arch shapes above a substrate from a side view, such that a space is between the arch shapes and the substrate, and the at least one first line part connects two adjacent arch shapes, and
wherein the at least one second line part is integral with the at least one first line part, and the plurality of first closed loop parts and the plurality of second closed loop parts are connected to each other.

2. The stretchable conductive pattern as claimed in claim 1, wherein at least one of the first closed loop parts has a rhombus shape.

3. The stretchable conductive pattern as claimed in claim 1, wherein at least one of the first closed loop parts has a curved closed loop shape.

4. The stretchable conductive pattern as claimed in claim 1, wherein the plurality of first closed loop parts and the at least one first line part are stretchable and exhibit an elastic restoring force.

5. The stretchable conductive pattern as claimed in claim 1, wherein the plurality of first closed loop parts and the first line part are integral with each other.

6. The stretchable conductive pattern as claimed in claim 1, wherein the closed-shaped frame is a wire surrounding the opening, the opening of each one of the plurality of first closed loop parts fills an entire area defined by an inner perimeter of the closed-shaped frame, and adjacent ones of the plurality of first closed loop parts are separated from each other by an empty space.

7. The stretchable conductive pattern as claimed in claim 1, wherein the plurality of second closed loop parts and the at least one second line part are integral with each other.

8. The stretchable conductive pattern as claimed in claim 1, wherein the first direction and the second direction are perpendicular to each other, and at least one of the first closed loop parts is adjacent to at least one of the second closed loop parts.

9. The stretchable conductive pattern as claimed in claim 1, wherein a portion of the at least one first line part that crosses a portion of the at least one second line part is closer to the substrate than any other portion of the at least one first line part.

10. The stretchable conductive pattern as claimed in claim 1, wherein the openings of the plurality of first closed loop parts do not overlap with the openings of the plurality of second closed loop parts.

11. A stretchable device, comprising:
a stretchable substrate; and
a stretchable conductive pattern on the stretchable substrate, the stretchable conductive pattern including:
a plurality of first closed loop parts spaced apart from each other in a first direction, each one of the plurality of first closed loop parts including an opening surrounded by a closed-shaped frame;
a plurality of second closed loop parts spaced apart from each other in a second direction crossing the first direction, each one of the plurality of second closed loop parts including an opening surrounded by a closed-shaped frame;
at least one first line part extended in the first direction and connecting between adjacent first closed loop parts among the plurality of first closed loop parts; and at least one second line part extended in the second direction and connecting between adjacent second closed loop parts among the plurality of second closed loop parts, wherein the at least one first line part directly connects the closed-shaped frames, wherein the plurality of first closed loop parts have arch shapes above the stretchable substrate from a side view, such that a space is between the arch shapes and the stretchable substrate, and the at least one first line part is directly on the stretchable substrate and connects two adjacent arch shapes, and wherein the at least one second line part is integral with the at least one first line part, and the plurality of first closed loop parts and the plurality of second closed loop parts are connected to each other.

12. The stretchable device as claimed in claim 11, wherein the plurality of first closed loop parts and the at least one first line part are integral with each other.

13. The stretchable device as claimed in claim 12, wherein the plurality of second closed loop parts and the at least one second line part are integral with each other.

14. The stretchable device as claimed in claim 12, wherein the first direction and the second direction are perpendicular to each other, and at least one of the first closed loop parts neighbors at least one of the second closed loop parts.

15. The stretchable device as claimed in claim 12, wherein the stretchable conductive pattern is a touch sensor of a self capacitance type.

* * * * *